United States Patent
Hung et al.

(10) Patent No.: US 9,401,358 B1
(45) Date of Patent: Jul. 26, 2016

(54) SEMICONDUCTOR DEVICE STRUCTURE

(71) Applicant: United Microelectronics Corp., Hsinchu (TW)

(72) Inventors: Ching-Wen Hung, Tainan (TW); Chih-Sen Huang, Tainan (TW); Yi-Wei Chen, Taichung (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 14/611,843

(22) Filed: Feb. 2, 2015

(30) Foreign Application Priority Data

Jan. 8, 2015 (TW) .............................. 104100523 A

(51) Int. Cl.
*H01L 29/00* (2006.01)
*H01L 27/08* (2006.01)
*H01L 27/06* (2006.01)

(52) U.S. Cl.
CPC ........ *H01L 27/0802* (2013.01); *H01L 27/0629* (2013.01); *H01L 27/0647* (2013.01)

(58) Field of Classification Search
CPC ............ H01L 27/0802; H01L 27/0629; H01L 27/0647
USPC .......................................................... 257/536
See application file for complete search history.

(56) References Cited

U.S. PATENT DOCUMENTS

| 8,754,741 B2 | 6/2014 | Williams et al. | |
| 2006/0238292 A1* | 10/2006 | Beach | H01L 23/5228 338/309 |
| 2008/0122035 A1* | 5/2008 | Watanabe | H01C 7/006 257/536 |

* cited by examiner

*Primary Examiner* — Tu-Tu Ho
(74) *Attorney, Agent, or Firm* — J.C. Patents

(57) ABSTRACT

A semiconductor device structure having at least one thin-film resistor structure is provided. Through the metal plug(s) or metal wirings located on different layers, a plurality of stripe segments of the thin-film resistor structure is electrically connected to ensure the thin-film resistor structure with the predetermined resistance and less averting areas in the layout design.

17 Claims, 6 Drawing Sheets

SEMICONDUCTOR DEVICE STRUCTURE

CROSS-REFERENCE TO RELATED APPLICATION

This application claims the priority benefit of Taiwan application serial no. 104100523, filed on Jan. 8, 2015. The entirety of the above-mentioned patent application is hereby incorporated by reference herein and made a part of this specification.

BACKGROUND OF THE INVENTION

1. Field of the Invention

The present invention generally relates to a semiconductor device structure, in particular, to a semiconductor device structure comprising a thin film resistor structure.

2. Description of Related Art

Following the rapid progresses in the industries of digital computers, wireless communications, internet appliances and portable electronic products, the design of the electronic products shifts toward miniaturization and high-frequency. In order to satisfy the needs of high-frequency communications, the characteristics of the passive components in the high-frequency environment become more significant. The size and features of the traditional passive components are unable to meet the needs of high-frequency electronic products. However, as the properties of the materials of the thin film passive components fulfil the high-frequency characteristics and have good workability, the thin film passive components are rather compatible with the high-frequency components.

However, large space areas (averting areas) are often required in the layout design of the thin film passive components and the layout area of the active components has to be shrunk accordingly, leading to less efficient layout design.

SUMMARY OF THE INVENTION

The embodiment of the present invention provides a semiconductor device structure having an integrated thin film resistor structure, and the integrated thin film resistor structure is composed of multiple rectangular segments parallel to and separate from one another and electrically connected through metal plugs or metal wiring located at different layers, so that the total averting area needed for the layout of the integrated thin film resistor structure becomes significantly less and the integrated thin film resistor structure is obtained with a predetermined resistance.

The embodiment of the present invention provides a semiconductor device structure comprising a substrate. The substrate has at least one active component region and a non-active component region, and at least one thin film resistor structure is disposed in the non-active component region. The at least one thin film resistor structure is spaced from the least one active component region with a specific distance. The at least one thin film resistor structure comprises a plurality of rectangular structures and each of the plurality of rectangular structures sequentially includes an oxide layer and a metal material layer located on the oxide layer. The plurality of rectangular structures includes a first strip resistor structure and a second strip resistor structure, and the first and second strip resistor structures are parallel to each other and separate from each other. Also, the first and second strip resistor structures are electrically connected to each other through metal connection structures, and the metal connection structures are selected from at least two of the group consisting of a wiring structure, a plug and a conductor wire structure.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
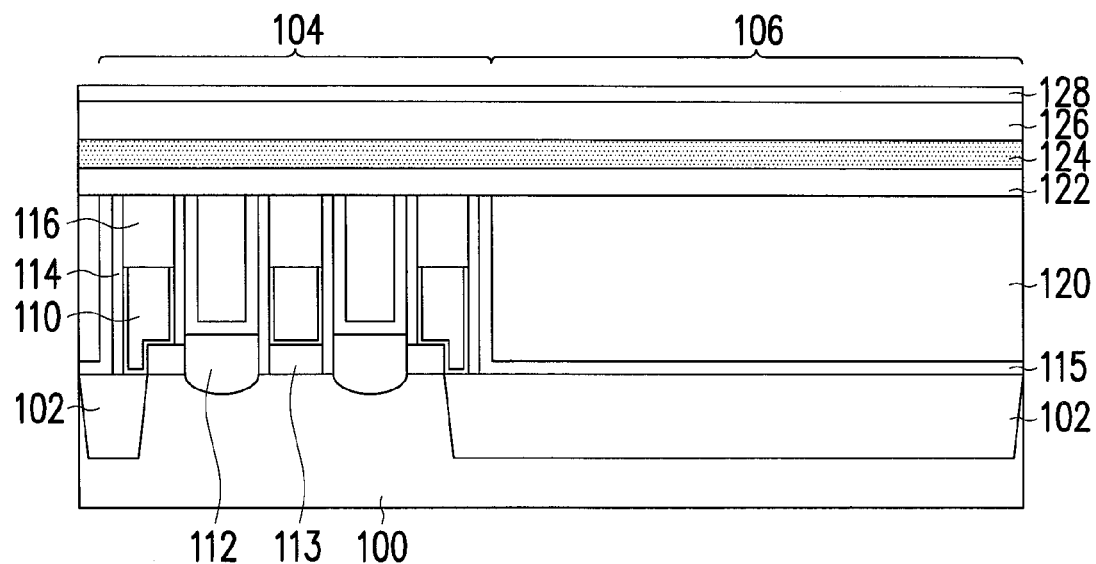
FIGS. 1A-1H are schematic cross-sectional views showing the process steps of the manufacturing process for a semiconductor device structure comprising at least one thin film resistor structure according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Although the properties of the materials of the thin film passive components fulfil the high-frequency characteristics and have good workability, large space areas are often required in the layout design of the thin film passive components and the layout area of the active components has to be shrunk accordingly, leading to less efficient layout design.

According to the layout design rules of the components, a specific distance is required to be kept between the thin film resistor structure(s) and other active components, so that a space area (averting area) exists between the thin film resistor structure(s) and other active components. Without violating the layout design rules, the design of the present invention changes the thin film resistor structure of a single long stripe into an integrated thin film resistor structure of multiple rectangular segments parallel to and separate from one another, so that the total space area needed for the layout of the thin film resistor structure becomes significantly less. Also, metal plugs or metal wiring located at different layers may be used to achieve the electrical connection between the multiple segments of the integrated thin film resistor structure and to ensure the thin film resistor structures having the predetermined resistance.

In the following paragraphs, the manufacturing process steps of the replacement metal gate structures are described as an example to illustrate partially the manufacturing process steps of the semiconductor device structure having the thin film resistor structures, in order to show the configuration of the thin film resistor structures, the relative positions thereof and the layout of the semiconductor device structure. It is not intended to limit the method or the structure by the exemplary embodiments described herein.

FIGS. 1A-1H are schematic cross-sectional views showing the process steps of the manufacturing process for a semiconductor device structure comprising at least one thin film resistor structure according to an embodiment of the present invention.

Referring to FIG. 1A, a semiconductor substrate 100 is provided and the semiconductor substrate 100 has at least one shallow trench isolation structure 102 buried therein to define an active component region 104 and a non-active component region 106. The active component region 104 may be a transistor setting region and the non-active component region 106 may be a passive component setting region or a dummy component setting region, for example. The replacement metal gate (RMG) process may be applied to form a plurality of metal gate structures 110, silicon fins 113 underlying the metal gate structures 110 and epitaxial source/drain regions 112 surrounded by the fins 113. Next, after forming conformal spacers 114 on both sides of the metal gate structures 110 and forming an etch stop layer 115 conformally covering the substrate 100, self-aligned contact masks 116 are formed on the metal gate structures 110. Then, an interlayer dielectric (ILD) layer 120 is formed to fill up the gaps between the metal gate structures 110 within the active component region 104 and overlies the etch stop layer 115 and the trench isolation structure 102 in the non-active component region 106. Then, a buffer oxide layer 122, a high resistance metal material layer 124, a hard mask layer 126 and a cap oxide layer 128 are sequentially formed over the substrate 100. In this embodiment, the semiconductor substrate 100 may be a silicon substrate, and the material of the gate sidewall spacers 114 and/or the etch stop layer 115 may be, for example, silicon dioxide or silicon nitride. Each metal gate structure 110 includes a metal inner layer and a dielectric outer layer. For example, the metal inner layer may be constituted by a low resistivity metal material such as aluminum or tungsten, and the dielectric outer layer may be constituted by a high dielectric material such as hafnium silicate, zirconium silicate, hafnium dioxide or zirconium dioxide. The material of the high resistance metal material layer 124 may include, for example titanium nitride (TiN), tantalum nitride (TaN), chromium silicide (CrSi), nickel-chromium alloys (NiCr) formed by chemical vapor deposition (CVD). The thickness of the high resistance metal material layer 124 ranges from about 30 angstroms to 60 angstroms. The hard mask layer 126 may be a silicon nitride layer formed by sub-atmospheric pressure chemical vapor deposition (SACVD), for example.

It will be appreciated that the materials for the semiconductor device structure described herein are only for illustrative purposes and not intended to limit the scope of the invention, as the materials may be replaced by other materials without departing from the scope of the invention.

Figure 1B:
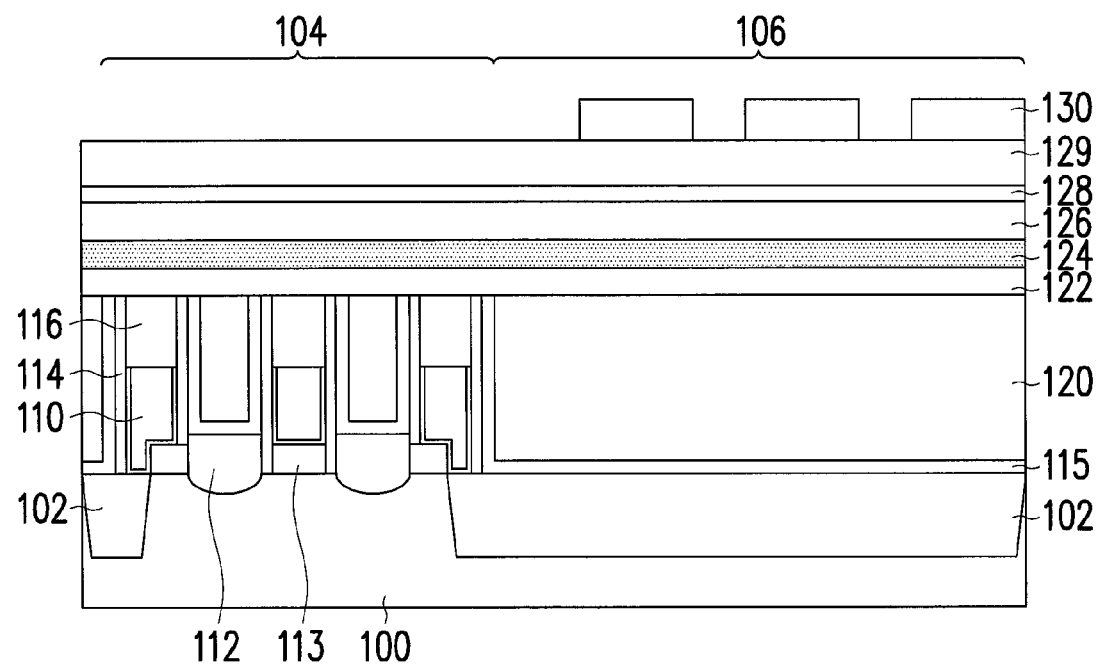

Referring to FIG. 1B, an antireflection layer 129 is formed on the cap oxide layer 128, and then a patterned photoresist layer 130 is formed on the antireflection layer 129.

Figure 1C:
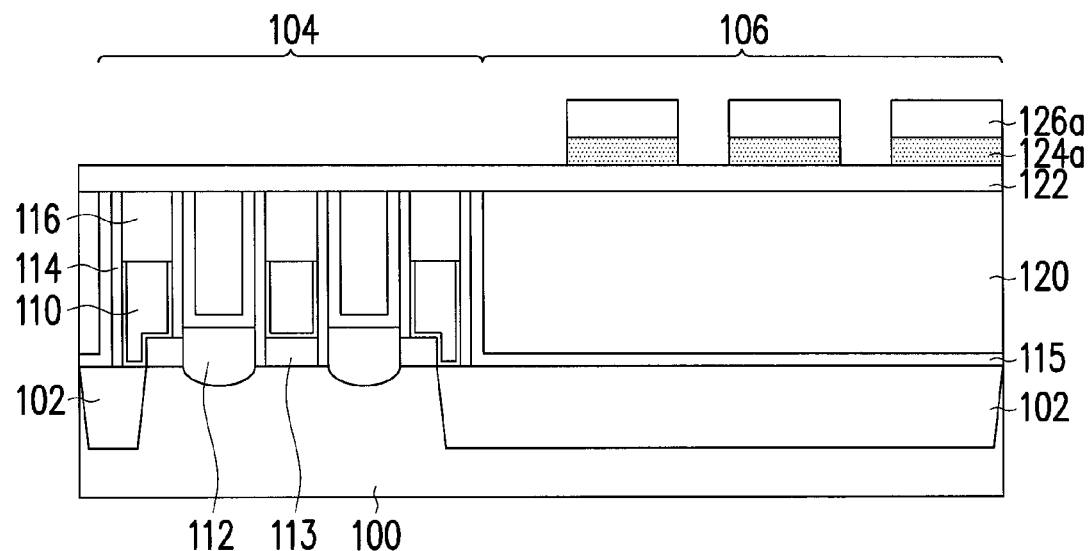
Figure 2:
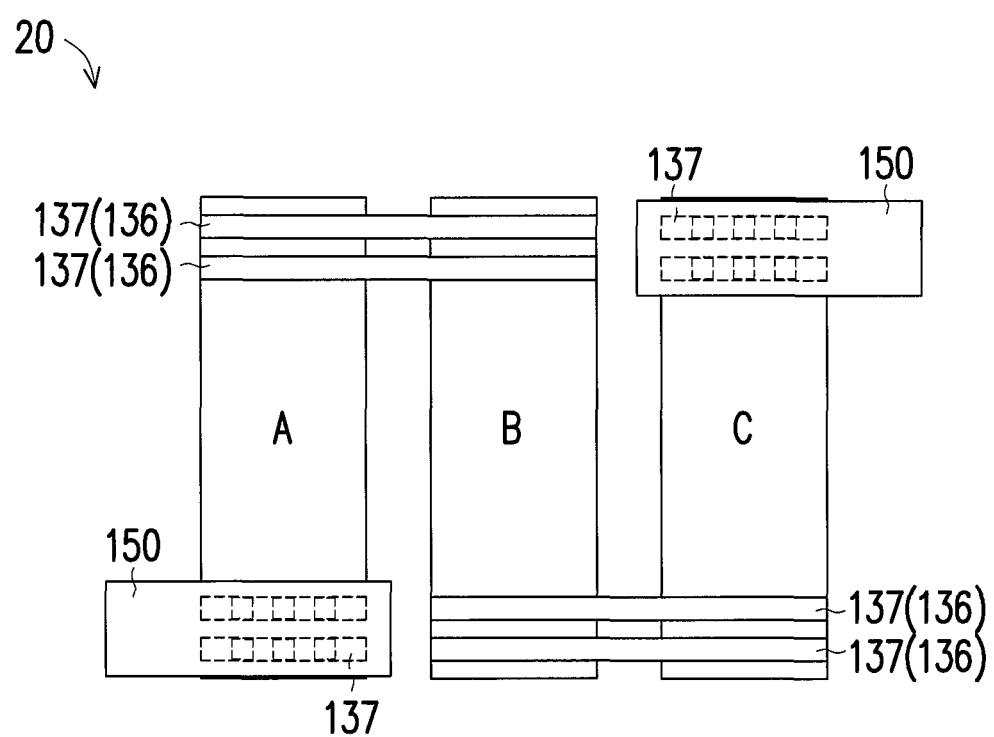
FIG. 2 is a schematic top view showing a portion of the thin film resistor structures of the semiconductor device structure according to the embodiment of the present invention.

Referring to FIG. 1C, using the patterned photoresist layer 130 as an etching mask, the etching process is performed until the buffer oxide layer 122 is exposed, to form the patterned high resistance metal material layer 124a, the patterned hard mask layer 126a. The patterned high resistance metal material layer 124a comprises at least a plurality of strip resistor segments as shown in FIG. 2. The patterned high resistance metal material layer 124a/hard mask layer 126a are patterned to form multiple parallel rectangular strip structures, and the patterned high resistance metal material layer 124a includes at least multiple strip resistor segments A, B, C (from the top view). FIG. 2 shows only the portion of the non-active region portion 106 and the hard mask layer 126a in FIG. 2 is shown as transparent for illustrating the relative position and shape of the patterned thin film resistor strip structures A, B, C. The thin film resistor structure A or C is separate from the active component region 104 at least with a specific distance; in general, the specific distance is at least 1 micron. Then, the residual cap oxide layer 128, the antireflection layer 129 and the photoresist layer 130 are removed at the same time. FIG. 2 shows three segments of rectangular strip structures arranged in parallel, but the design of the present invention may also be directed to two segments, or four or five segments. The number of segments of the strip structures is not limited to three and may be adjusted according to the predetermined total resistance of the thin film resistor structures or the required reduction ratio of the space area (averting area). Assuming the metal gate structure 110 formed within the active component region 104 being a long strip structure, the long side of the thin film resistor strip structure A, B or C formed in the non-active component region 106 is parallel to the long side of the metal gate structure 110. Alternatively, the long side of the thin film resistor strip structure A, B or C formed in the non-active component region 106 is perpendicular to the long side of the metal gate structure 110.

Figure 1D:
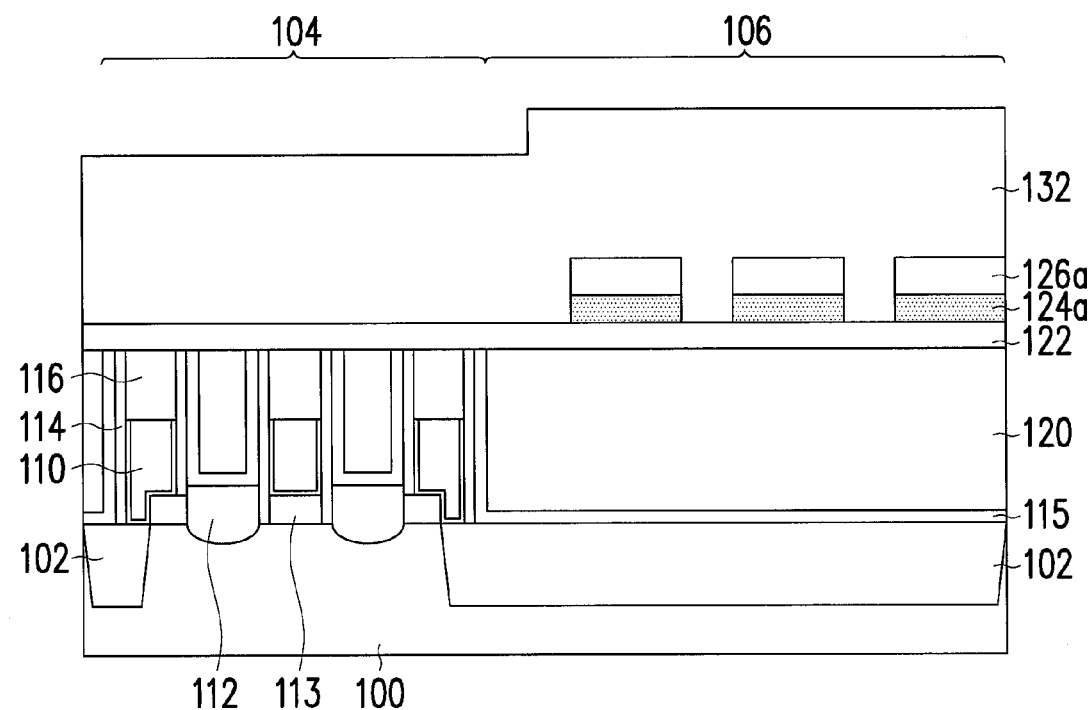

In FIG. 1D, a pre-metal dielectric (PMD) layer 132 is formed to cover the active component region 104 and the non-active component region 106.

Figure 1E:
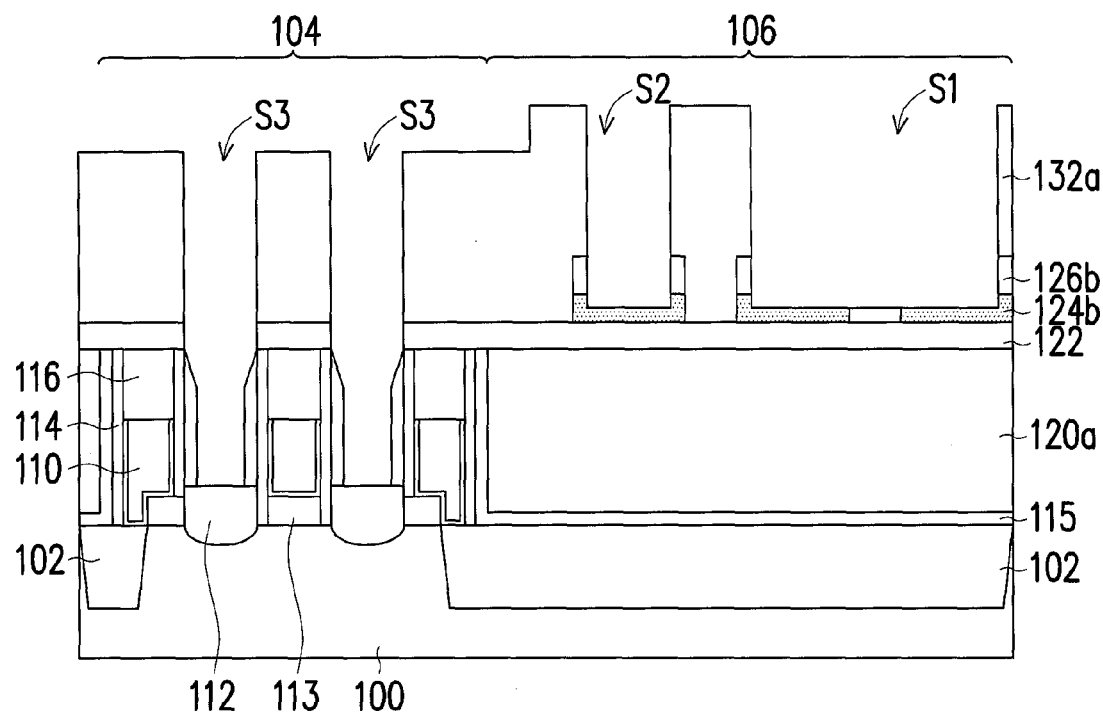

Referring to FIG. 1E, a portion of the pre-metal dielectric layer 132 in the active component region 104 is removed to form contact openings S3 penetrating through the pre-metal dielectric layer 132, and the interlayer dielectric layer 120 between the metal gate structures 110 is removed. In the non-active component region 106, the pre-metal dielectric layer 132, the hard mask layer 126a, the high resistance metal material layer 124a are partially removed to form contact openings S1 and S2, and the contact openings S1 and S2 penetrate through the pre-metal dielectric layer 132 and the hard mask layer 126a without penetrating through the high resistance metal material layer 124a, so as to form the patterned pre-metal dielectric layer 132a, the patterned interlayer dielectric layer 120a, the patterned high resistance metal material layer 124b and the patterned hard mask layer 126b. Referring to FIG. 2, the contact opening S2 is formed at a position corresponding to the position of the rectangular strip structure A, and the contact opening S1 is formed at a position corresponding to and across the positions the two parallel rectangular strip structures B and C.

Figure 1F:
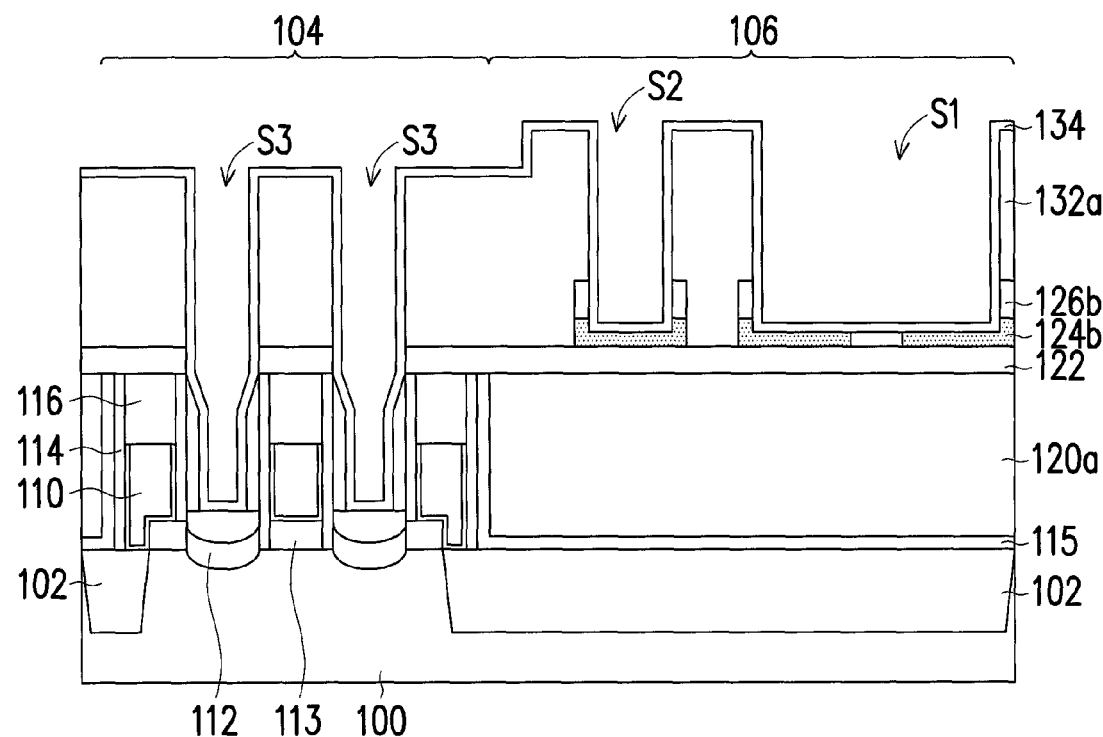

See FIG. 1F, a barrier metal layer 134 is formed to conformally cover the active component region 104 and the non-active component region 106. The barrier metal layer 134 conformally covers the inner surfaces of the contact openings S1, S2 and S3. The barrier metal layer 134 may be a composite layer of titanium, titanium nitride, or titanium/titanium nitride, for example. Next, a metal silicidation process is performed, so that titanium in the barrier metal layer 134 reacts with silicon in the epitaxial source/drain regions 112 during the heating process to form titanium silicide.

Figure 1G:
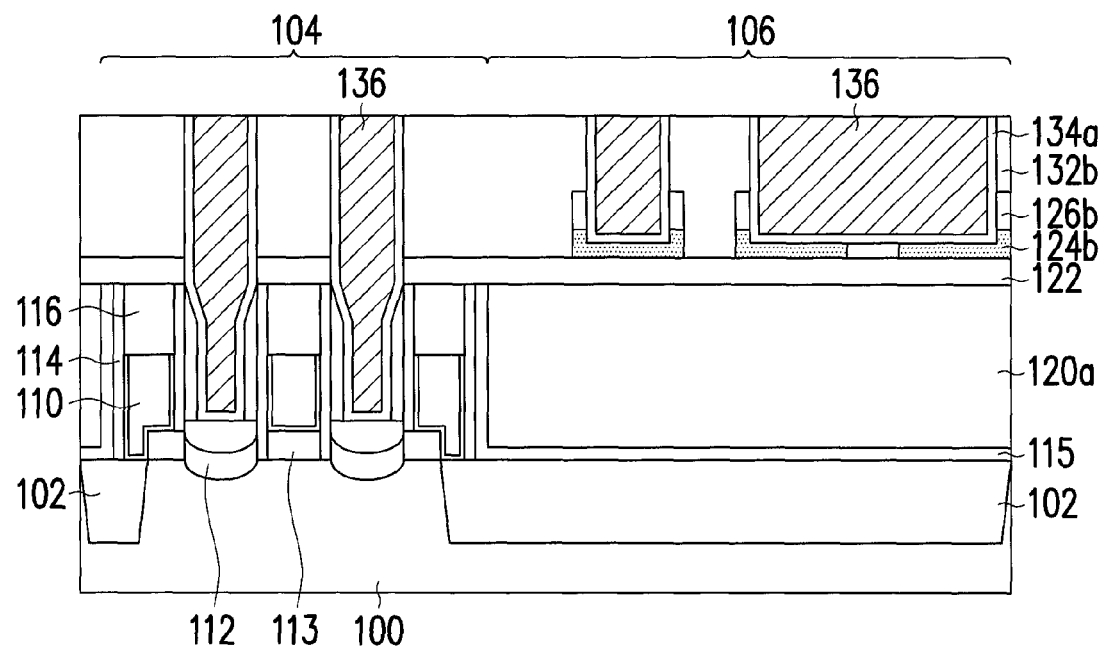

Referring to FIG. 1G, a metal material (not shown) is formed to cover the barrier metal layer 134 and fill up the contact openings S1, S2 and S3. Next, the chemical mechanical polishing (CMP) process is performed to remove and planarize the excess metal material, the barrier metal layer 134 and the pre-metal dielectric layer 132a to form the metal layer 136, the barrier metal layer 134a and the pre-metal dielectric layer 132b are formed. In this embodiment, the material of the metal layer 136 includes tungsten, and the chemical mechanical polishing (CMP) process may be a tungsten chemical mechanical polishing process, for example. In fact, the metal layer 136 and the barrier metal layer 134a may compose a metal connection structure. Herein, the metal connection structure consisting of the metal layer 136 and the barrier metal layer 134a may be regarded as a wiring structure 137. From the top view of FIG. 2, the metal layer 136 (and the barrier metal layer 134a) formed within the contact opening S1 is the metal connection structure (the wiring structure 137) connecting two parallel rectangular strip structures B and C, while the metal layer 136 (and the barrier metal layer 134a) formed within the contact opening S2 is used to connect the rectangular strip structure A.

Figure 1H:
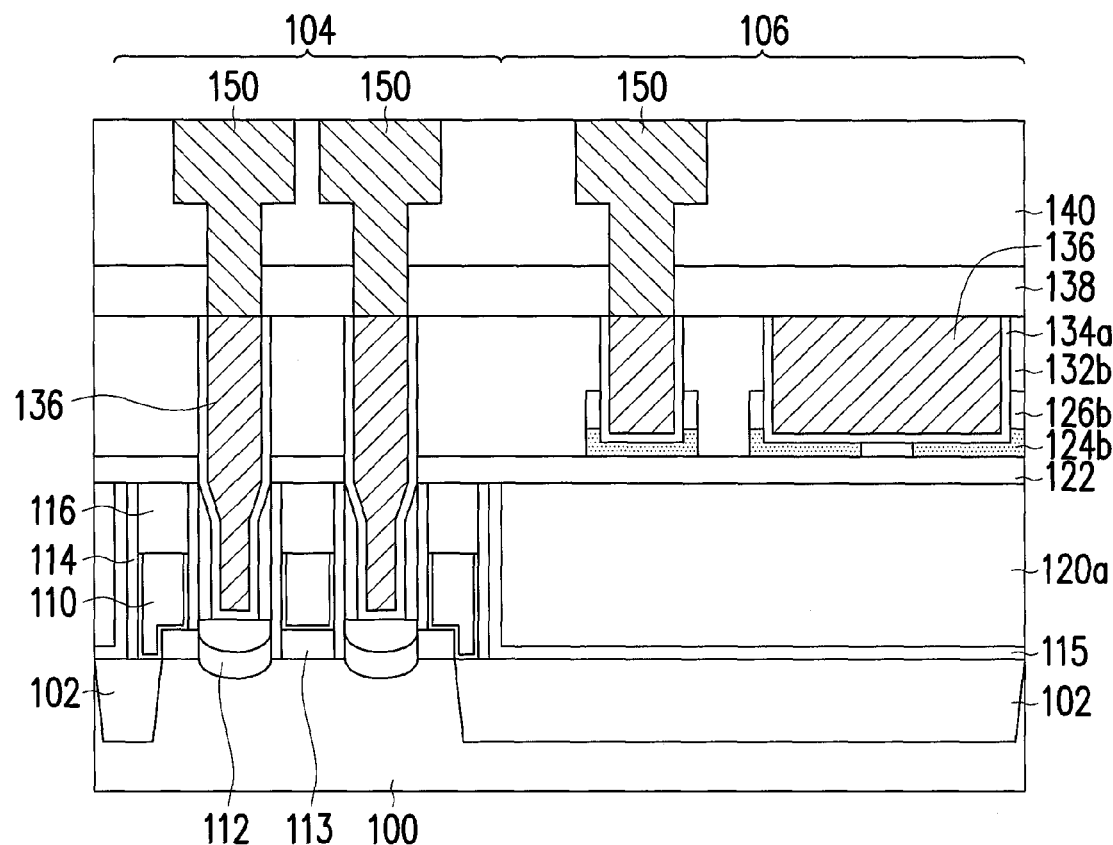

Referring to FIG. 1H, after forming an etch barrier layer 138 and another interlayer dielectric layer 140 over the metal layer 136, conductor wire structures 150 are formed in the active component region 104 and the non-active component regions 106 and respectively connected to the metal layer 136 within the contact openings S1, S2 and S3. The method of forming the conductor wire structures 150 includes, for example, performing a via-first process to form via holes and then trenches penetrating through the etch barrier layer 138 and the interlayer dielectric layer 140, and then filling up the trenches and via holes with a metal material to form a dual damascene structure. The so-called dual damascene structure may be formed by the via-first process or the trench-first process, and such dual damascene structure may be regarded as a metal connection structure consisting of a plug (formed in the via hole) and a conductor wire (formed in the trench). The material of the conductor wire structures 150 may include aluminum, copper, tungsten, or the combination thereof. In addition, the conductor wire structure 150 may further comprise a barrier metal layer (not shown) between the metal material and the insulating layer (between the etch barrier layer 138 and the interlayer dielectric layer 140), to prevent the diffusion of the metal material. Of course, even though the conductor wire structure described in the present embodiment is a dual damascene structure, it is understood that a connection structure equivalent to a dual damascene metal structure but formed separately as a plug and a conductor wire is encompassed within the scope of the present invention.

The etch barrier layer 138 and the interlayer dielectric layer 140 are shown as being transparent in FIG. 2 for illustrating the relative positions of the wiring structures 137 (the metal layer 136) and the conductor wire structures 150, and the wiring structures 137 covered by the conductor wire structures 150 are shown as dashed line strips and dashed line square holes are used to indicate the locations of the via holes of the conductor wire structures 150. From the schematic top view of FIG. 2, the conductor wire structures 150 are respectively connected to one end of the rectangular strip structure A and one end of the rectangular strip structure C located at two opposite sides of the rectangular strip structures. The conductor wire structure 150 is connected to the metal connection structures (the wiring structures 137) each consisting of the metal layer 136 and the barrier metal layer 134a located within the contact opening S2 and is electrically connected to the rectangular strip structure A. Similarly, the conductor wire structure 150 is electrically connected to the rectangular strip structure C through the wiring structures 137. The rectangular strip structures A and B are electrically connected through the metal connection structures (the wiring structures 137) consisting of the metal layer 136 and the barrier metal layer 134a, while the rectangular strip structures B and C are electrically connected through the metal connection structures (the wiring structures 137) consisting of the metal layer 136 and the barrier metal layer 134a. Thus, these three parallel segments of the rectangular strip resistor structures A, B, C are electrically connected through the wiring structures 137 and the conductor wire structures 150, these three rectangular strip resistor structures A, B, C, which are electrically connected, constitute an integrated thin-film resistor structure 20.

Figure 3A:
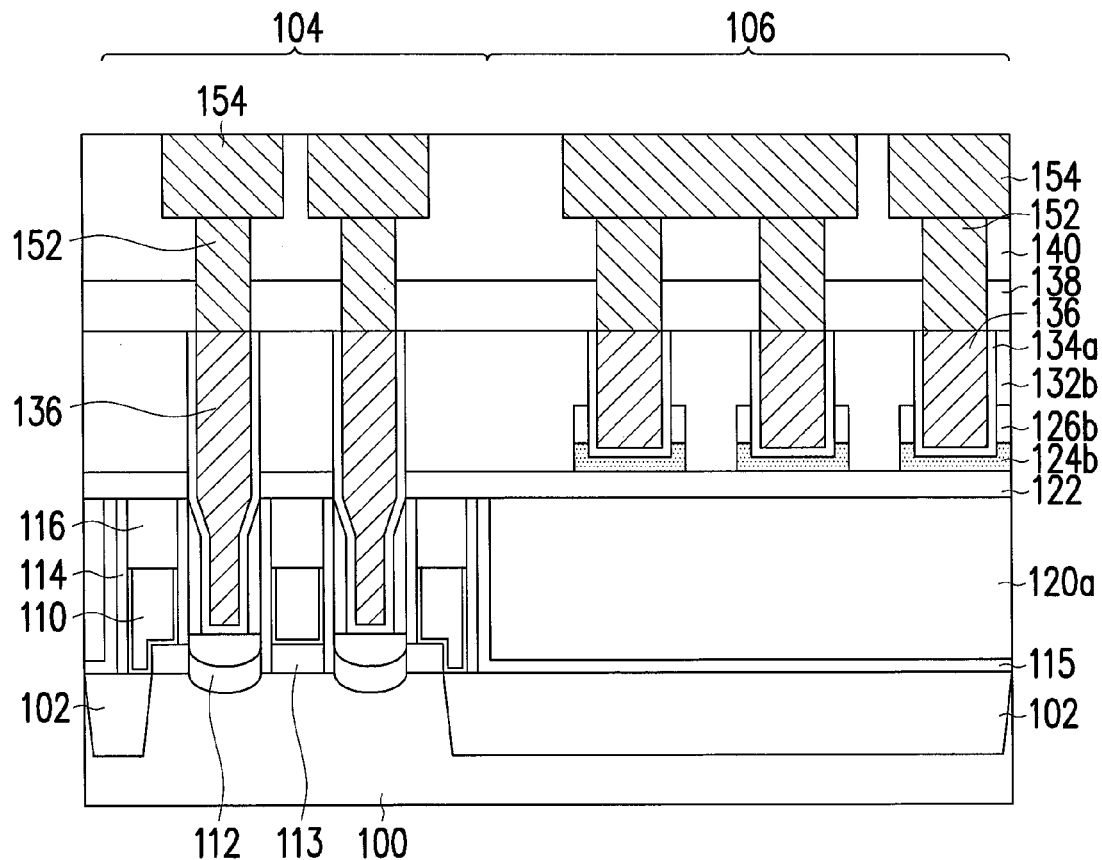
FIG. 3A is a schematic cross-sectional view of a semiconductor device structure comprising at least one thin film resistor structure according to another embodiment of the present invention.
Figure 3B:
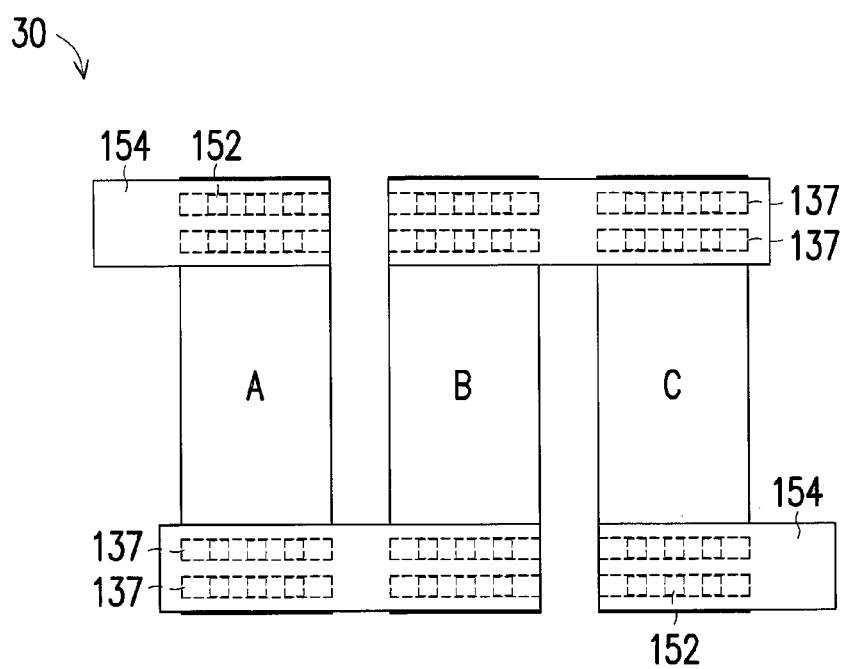
FIG. 3B is a schematic top view showing a portion of the thin film resistor structures of the semiconductor device structure of FIG. 3A.

According to another embodiment of the present invention, a different layout is designed for the thin film resistor structure for illustration purposes. FIG. 3A is a schematic cross-sectional view of a semiconductor device structure comprising at least one thin film resistor structure according to another embodiment of the present invention. FIG. 3B is a schematic top view showing a portion of the thin film resistor structures of the semiconductor device structure of FIG. 3A. FIG. 3B shows only the portion of the non-active component region. FIG. 3B mainly shows the relative positions of the wiring structures 137, the plugs 152 and the conductor wire structures 154, and dashed line square holes are used to indicate the via holes of the plugs 152.

As seen from FIGS. 3A-3B, the metal connection structures (the wiring structures 137) each consisting of the metal layer 136 and the barrier metal layer 134a are disposed at two opposite ends of individual rectangular strip resistive structure A, B or C, but are not disposed across two segments of the rectangular strip resistive structures. In FIG. 3B, the wiring structure 137 covered by the plugs 152 and the conductor wire structures 154 are shown in dashed lines. The rectangular striped structures A, B and C are electrically connected through the metal connection structures of the plugs 152 and the conductor wire structures 154 and the wiring structures 137. Thus, the three parallel segments of the rectangular strip resistor structures A, B and C are electrically connected through the metal connection structures (the wiring structures 137) consisting of the metal layer 136 and the barrier metal layer 134a as well as the plugs 152 and the conductor wire structures 154, and these three segments of the rectangular strip resistor structures A, B and C, which are electrically connected, constitute an integrated thin-film resistor structure 30. The materials of the wiring structure 137, the plug 152 and the conductor wire structure 154 may include aluminum, copper, tungsten, or any combination thereof. The material of the wiring structure 137 may include tungsten, for example. The material of the plug 152 and the conductor wire structure 154 may include aluminum, copper or combinations thereof, for example. For the structures shown in FIG. 3A-3B, the metal connection structures of the plugs 152 and the conductor wire structures 154 and the wiring structures 137 are utilized to achieve electrical connection. Depending on the manufacturing process flow or the design of the layout, it is possible to switch the conductor wire structure 150 (such as the dual damascene structure) with the metal connection structure of the plug 152 and the conductor wire structure 154.

For the design of the layout for thin film resistors, different layouts will lead to different values of resistance, and the required averting area will not be the same. For example, according to the exemplary design of the present invention, compared with the thin film resistor structure of a single strip structure, the integrated thin film resistor structure of multiple shorter strip segments may have the same or similar values of resistance, but with a smaller averting area (spaces areas) in the layout. The following examples design the integrated thin film resistor structures with the same overall length to be structures of multiple segments with different numbers of segments, in different lengths and widths and connected by different arrangements of connection structures, and the simulation results of their averting areas and the reduction ratio of the averting areas are listed in Tables 1 and 2. In Tables 1 & 2, the arrangement of the connection structures as shown in FIG. 2 is called A-type connection, while the arrangement of the connection structures as shown in FIG. 3B is called B-type connection.

TABLE 1

| Strip resistor structure | single strip | 4-strips A-type | 3-strips B-type | single strip | 4-strips A-type | 5-strips B-type |
|---|---|---|---|---|---|---|
| Width (micron) | 1 | 1 | 1 | 1 | 1 | 1 |
| Length (micron) | 12 | 3 | 4 | 20 | 5 | 4 |
| No. of strips | 1 | 4 | 3 | 1 | 4 | 5 |
| Distance between strips (micron) | 0.2 | 0.2 | 0.2 | 0.2 | 0.2 | 0.2 |
| Distance to main pattern (micron) | 1 | 1 | 1 | 1 | 1 | 1 |
| Total area of resistor structure (square micron) | 42 | 29.2 | 29.04 | 66 | 40.88 | 41.04 |
| Area reduction ratio | 100% | 69.5% | 69.1% | 100% | 61.9% | 62.2% |

TABLE 2

| Strip resistor structure | single strip | 4-strips A-type | 3-strips B-type | single strip | 4-strips A-type | 5-strips B-type |
|---|---|---|---|---|---|---|
| Width (micron) | 0.36 | 0.36 | 0.36 | 0.36 | 0.36 | 0.36 |
| Length (micron) | 12 | 3 | 4 | 20 | 5 | 4 |
| No. of strips | 1 | 4 | 3 | 1 | 4 | 5 |
| Distance between strips (micron) | 0.2 | 0.2 | 0.2 | 0.2 | 0.2 | 0.2 |
| Distance to main pattern (micron) | 1 | 1 | 1 | 1 | 1 | 1 |
| Total area of resistor structure (square micron) | 33.04 | 16.4 | 17.52 | 51.92 | 22.96 | 21.84 |
| Area reduction ratio | 100% | 49.6% | 53.0% | 100% | 44.2% | 42.1% |

Compared with the results in Table 1 and Table 2, by changing the layout design of a single thin strip resistor structure to be the layout designs of an integrated resistor structure of multiple strip segments, the averting areas needed for the integrated resistor structure in the layout design are less and higher reduction ratios of the averting area can be achieved, as shown in the results of Table 2. Moreover, layout design of a single thin strip resistor structure, the designs of more divided segments lead to lesser averting areas. From the results in Table 1, for the designs with the same width of 1 micron, the designs of multiple divided segments are effective in reducing the averting areas required to the integrated resistor structures in the layout design. According to the embodiments of the present invention, the (integrated) thin film resistor structure can be designed to be the structure of multiple segments of rectangular strip resistor structures, and designed to include at least two segments, preferably 3 to 5 segments, arranged parallel to each other or one another. The rectangular strip resistor structure has a length ranging from 10 microns to 30 microns, preferably 10 microns to 20 microns, and a width ranging from 0.3 microns to 1.0 microns, preferably 0.3 microns to 0.5 microns, for example. The thickness of the rectangular strip resistor structure may vary depending on the high resistance metal material used. For example, if the high-resistance metal material of the rectangular strip resistor structure of the thin film resistor structure is titanium nitride (TiN), the rectangular strip resistor structure of a thickness of 42~55 angstroms (Å) has the resistance Rs of 450Ω/~600Ω.

The thin film resistor structures provided in the examples are suitable for the design and implementation of the semiconductor components or devices applicable for high frequency communications or compatible with the semiconductor thin film deposition processes.

According to the simulation results of the examples, by altering the design of the thin film resistor structure as a single long strip into the configuration of an integrated thin film resistor structure of multiple shorter and parallel segments of rectangular strip thin film resistor structures, not only the required averting areas in the layout design can be reduced for better substrate utilization, but also better etching uniformity and pattern fidelity can be achieved for the integrated thin film resistor structure of multiple shorter and parallel segments.

In embodiments of the present invention, a plurality of shorter strip segments of the thin film resistor structures are electrically coupled together through metal connection structures located at different layers as an integrated thin film resistor structure. By doing so, the integrated thin film resistor structure is ensured to have a predetermined resistance as well as less averting areas in the layout design is required for the integrated thin film resistor structure.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A semiconductor device structure, comprising;
a substrate, wherein the substrate has at least one active component region and a non-active component region, at least one thin film resistor structure is disposed in the non-active component region, and the at least one thin film resistor structure is spaced from the least one active component region with a specific distance, wherein the at least one thin film resistor structure comprises a plurality of rectangular structures and each of the plurality of rectangular structures sequentially includes an oxide layer and a metal material layer located on the oxide layer, the plurality of rectangular structures includes a first strip resistor structure and a second strip resistor structure, the first and second strip resistor structures are parallel to each other and separate from each other, and the first and second strip resistor structures are electrically connected to each other through metal connection structures, and the metal connection structures are selected from at least two of the group consisting of a wiring structure, a plug and a conductor wire structure, wherein the active component region comprises at least one elongated strip gate structure, and a long side of the thin film resistor structure is parallel to a long side of the at least one elongated strip gate structure.

2. The structure of claim 1, wherein the plurality of rectangular structures further comprises a third strip resistor structure, the first, second and third strip resistor structures are parallel to one another and separate from one another, and the first, second and third strip resistor structures are electrically connected to one another through the metal connection structures, and the metal connection structures are selected from at least two of the group consisting of a wiring structure, a plug and a conductor wire structure.

3. The structure of claim 2, wherein a first end of the first strip resistor structure is electrically connected with a first end of the second strip resistor structure through the wiring structure disposed thereon, a second end of the second strip resistor structure is electrically connected with a second end of the third strip resistor structure through the wiring structure disposed thereon, and a second end of the first strip resistor structure is electrically connected with a first end of the third strip resistor structure through the wiring structure disposed thereon and the conductor wire structure disposed thereon, such that the first, second and third strip resistor structures are electrically connected to one another through the metal connection structures.

4. The structure of claim 2, wherein a first end of the second strip resistor structure is electrically connected with a first end of the third strip resistor structure through the wiring structure disposed thereon and the conductor wire structure disposed thereon, a second end of the second strip resistor structure is electrically connected with a second end of the first strip resistor structure through the wiring structure disposed thereon and the conductor wire structure disposed thereon, and a first end of the first strip resistor structure is electrically connected with a second end of the third strip resistor structure through the wiring structure disposed thereon and the conductor wire structure disposed thereon, such that the first, second and third strip resistor structures are electrically connected to one another through the metal connection structures.

5. The structure of claim 2, wherein a first end of the first strip resistor structure is electrically connected with a first end of the second strip resistor structure through the wiring structure disposed thereon, a second end of the second strip resistor structure is electrically connected with a second end of the third strip resistor structure through the wiring structure disposed thereon, and a second end of the first strip resistor structure is electrically connected with a first end of the third strip resistor structure through the wiring structure disposed thereon, the plugs and the conductor wire structure disposed thereon, such that the first, second and third strip resistor structures are electrically connected to one another through the metal connection structures.

6. The structure of claim 2, wherein a first end of the second strip resistor structure is electrically connected with a first end of the third strip resistor structure through the wiring structure disposed thereon, the plugs and the conductor wire structure disposed thereon, a second end of the second strip resistor structure is electrically connected with a second end of the first strip resistor structure through the wiring structure disposed thereon, the plugs and the conductor wire structure disposed thereon, and a first end of the first strip resistor structure is electrically connected with a second end of the third strip resistor structure through the wiring structure disposed thereon, the plugs and the conductor wire structure disposed thereon, such that the first, second and third strip resistor structures are electrically connected to one another through the metal connection structures.

7. The structure of claim 1, wherein a material of the metal connection structures includes aluminum, copper, tungsten or any combination thereof.

8. The structure of claim 7, wherein a material of the wiring structure includes tungsten.

9. The structure of claim 7, wherein a material of the plug or the conductor wire structure includes aluminum or copper.

10. The structure of claim 1, wherein a material of the metal material layer includes titanium nitride (TiN), tantalum nitride (TaN), chromium silicide (CrSi) or nickel-chromium alloys (NiCr).

11. The structure of claim 10, wherein a thickness of the metal material layer ranges from 30 Å to 60 Å.

12. A semiconductor device structure, comprising;
a substrate, wherein the substrate has at least one active component region and a non-active component region, at least one thin film resistor structure is disposed in the non-active component region, and the at least one thin film resistor structure is spaced from the least one active component region with a specific distance, wherein the at least one thin film resistor structure comprises a plurality of rectangular structures and each of the plurality of rectangular structures sequentially includes an oxide layer and a metal material layer located on the oxide layer, the plurality of rectangular structures includes a first strip resistor structure and a second strip resistor structure, the first and second strip resistor structures are parallel to each other and separate from each other, and the first and second strip resistor structures are electrically connected to each other through metal connection structures, and the metal connection structures are selected from at least two of the group consisting of a wiring structure, a plug and a conductor wire structure, wherein the active component region comprises at least one elongated strip gate structure, a long side of the thin film resistor structure is perpendicular to a long side of the at least one elongated gate structure.

13. The structure of claim 12, wherein the plurality of rectangular structures further comprises a third strip resistor structure, the first, second and third strip resistor structures are parallel to one another and separate from one another, and the first, second and third strip resistor structures are electrically connected to one another through the metal connection structures, and the metal connection structures are selected from at least two of the group consisting of a wiring structure, a plug and a conductor wire structure.

14. The structure of claim 13, wherein a first end of the first strip resistor structure is electrically connected with a first end of the second strip resistor structure through the wiring structure disposed thereon, a second end of the second strip resistor structure is electrically connected with a second end of the third strip resistor structure through the wiring structure disposed thereon, and a second end of the first strip resistor structure is electrically connected with a first end of the third strip resistor structure through the wiring structure disposed thereon and the conductor wire structure disposed thereon, such that the first, second and third strip resistor structures are electrically connected to one another through the metal connection structures.

15. The structure of claim 13, wherein a first end of the second strip resistor structure is electrically connected with a first end of the third strip resistor structure through the wiring structure disposed thereon and the conductor wire structure disposed thereon, a second end of the second strip resistor structure is electrically connected with a second end of the first strip resistor structure through the wiring structure disposed thereon and the conductor wire structure disposed thereon, and a first end of the first strip resistor structure is electrically connected with a second end of the third strip resistor structure through the wiring structure disposed thereon and the conductor wire structure disposed thereon, such that the first, second and third strip resistor structures are electrically connected to one another through the metal connection structures.

16. The structure of claim 13, wherein a first end of the first strip resistor structure is electrically connected with a first end of the second strip resistor structure through the wiring structure disposed thereon, a second end of the second strip resistor structure is electrically connected with a second end of the third strip resistor structure through the wiring structure disposed thereon, and a second end of the first strip resistor structure is electrically connected with a first end of the third strip resistor structure through the wiring structure disposed thereon, the plugs and the conductor wire structure disposed thereon, such that the first, second and third strip resistor structures are electrically connected to one another through the metal connection structures.

17. The structure of claim 13, wherein a first end of the second strip resistor structure is electrically connected with a first end of the third strip resistor structure through the wiring structure disposed thereon, the plugs and the conductor wire structure disposed thereon, a second end of the second strip resistor structure is electrically connected with a second end of the first strip resistor structure through the wiring structure disposed thereon, the plugs and the conductor wire structure disposed thereon, and a first end of the first strip resistor structure is electrically connected with a second end of the third strip resistor structure through the wiring structure disposed thereon, the plugs and the conductor wire structure disposed thereon, such that the first, second and third strip resistor structures are electrically connected to one another through the metal connection structures.

\* \* \* \* \*